US007685547B1

(12) United States Patent
Gupta et al.

(10) Patent No.: US 7,685,547 B1
(45) Date of Patent: Mar. 23, 2010

(54) METHOD, SYSTEM, AND COMPUTER PROGRAM PRODUCT FOR GENERATING AUTOMATED ASSUMPTION FOR COMPOSITIONAL VERIFICATION

(75) Inventors: Anubhav Gupta, Berkeley, CA (US); Ken L. McMillan, Berkeley, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 224 days.

(21) Appl. No.: 11/772,792

(22) Filed: Jul. 2, 2007

(51) Int. Cl.
*G06F 17/50* (2006.01)
*G06F 9/45* (2006.01)

(52) U.S. Cl. .................................. 716/5
(58) Field of Classification Search ................. None
See application file for complete search history.

(56) References Cited

OTHER PUBLICATIONS

R. Alur et al., "Parametric Temporal Logic for 'Model Measuring'", ACM Transactions on Computational Logic, vol. 2, No. 3, Jul. 2001, pp. 388-407.*
R. L. Rivest et al., "Inference of Finite Automata Using Homeing Sequences," 1989 ACM, pp. 411-420.*
Pena et al., "A New Algorithm for the Reduction of Incompletely Specified Finite State Machnes," ICCAD98, 1998 ACM, pp. 482-489.*
J. Cobleigh et al., "Learning Assumptions for Compositional Verification," ETAPS 2003 and TACAS 2003, 16 pages.*
C. P. Pfleeger, "State Reduction in Incompletely Specified Finite-State Machines," IEEE Trans. on Computer, vol. C-22, No. 12, Dec. 1973, pp. 1099-1102.*
A. L. Oliveira et al., "Efficient Algorithms for the Inference of Minimum Size DFAs," Machine Learning, 44, 93-119, dated 2001,27 pages.*
A. L. Oliveira et al., "Efficient Search Techniques for the Inference of Minimum Size Finite Automata," no date, 9 pages.*
Angluin, "Learning Regular Sets from Queries and Counterexamples," Information and Computation 75, pp. 87-106, dated 1987 by Academic Press, Inc.*
Lucas et al., "Learning DFA: Evolution versus Evidence Driven State Merging," pp. 351-358, dated 2003 by IEEE.*
EP Search Report for corresponding EP application, 8 pages, dated Oct. 28, 2008.
Anubhav Gupta et al.: "Autmated Assumption Generation for Compositional Verification"; Computer Aided Verification; (Lecture Notes in Computer Science), Springer Berlin Heidelberg, Berlin, Heidelberg, vol. 4590; Jul. 3, 2007; pp. 420-432.
Yunshan Zhu et al.: "Generator-Based Verification"; IEEE/ACM International Conference on Computer Aided Design. ICCAD 2003; IEEE/ACM Digest of Technical Papers. San Jose, CA, Nov. 9-13, 2003; (IEEE/ACM International Conference on Computer-Aided Design), New York, NY: ACM, US, Nov. 9, 2003; pp. 146-153.

(Continued)

*Primary Examiner*—Leigh Marie Garbowski
(74) *Attorney, Agent, or Firm*—Vista IP Law Group LLP

(57) ABSTRACT

Disclosed are methods, systems, and computer program products for computing an exact minimal automaton to act as an intermediate assertion in assume-guarantee reasoning. In one embodiment, the computing an exact minimal automaton is performed by using a sampling approach and a Boolean satisfiability. The methods described herein may be used as part of a tool for formal verification.

55 Claims, 12 Drawing Sheets

OTHER PUBLICATIONS

Rajeev Alur et al.: "Symbolic Compositional Verification by Learning Assumption"; Computer Aided Verification; (Lecture Notes in Computer Science;; LNCS), Springer-Verlag, Berlin/Heidelberg, vol. 3576, Jul. 20, 2005; pp. 548-562.

Jorge M Pena et al.: "A New Algorithm for Exact Reduction of Incompletely Specified Finite State Machines"; IEEE Transactions on Computer Aided Design of Integratedcircuits and Systems; IEEE Service Center, Piscatway, NJ, US, vol. 18, No. 11; Nov. 1, 1999.

* cited by examiner

METHOD, SYSTEM, AND COMPUTER PROGRAM PRODUCT FOR GENERATING AUTOMATED ASSUMPTION FOR COMPOSITIONAL VERIFICATION

BACKGROUND AND SUMMARY

In the context of hardware and software systems, software testing has been extensively deployed to debug a system or to demonstrate that a system exhibits some properties. Nonetheless, software testing oftentimes cannot by itself prove that a system does not have a certain type of defect. Nor can it demonstrate, also by itself, that a system exhibits certain properties. On the other hand, formal verification can sufficiently prove or disprove the correctness of a software and hardware system by using mathematical methods and thus prove that the system of interest does not have certain defects or does exhibit certain properties.

More specifically, by using abstract mathematical models, formal verification attempts to prove that the system of interest meets certain requirements or that the system can exhibit certain properties or behaviors. That is, formal verification of such systems is performed by providing a formal proof on an abstract mathematical model of these systems. Some typical examples of mathematical objects often used to model systems are finite state machines and various automata.

There are generally two approaches to the formal verification process. One approach is commonly referred to as model checking. Model checking often comprises of a systematically exhaustive exploration of a finite mathematical model and verifies the system of interest by exploring all states and transitions in the model. Model checking also oftentimes invokes some abstraction techniques to avoid having to consider each individual state in the system so as to reduce computation time.

The other approach is logical inference which comprises of a formal version of mathematical reasoning about the system involving certain theorem proving processes. The items to be verified are often expressed in terms of some form of temporal logics such as linear temporal logic or computational tree logic. The drawback of this latter logical inference approach is that the logical inference approach is usually partially automated, and its efficiency and viability may turn on the user's knowledge about the system of interest.

Due to various limitations and drawbacks of the logical inference approach, model checking has been the widely accepted technique for formally verifying the correctness of hardware and software systems. One of the major hurdles for the wide-applicability of this technique is the state-explosion problem, arising from the increasing complexity of real world systems. Compositional verification is an approach for alleviating the state-explosion problem. The compositional verification decomposes a verification task for the software and hardware system into simpler verification problems for the individual components of the system. For example, consider a system M which is composed of two components $M_1$ and $M_2$, and a property P that needs to be verified on M. The assume-guarantee style for compositional verification uses an inference rule which states: P can be verified on M by identifying an assumption A such that A holds on $M_1$ in all environments and $M_2$ satisfies P in any environment that satisfies A. The key to the successful application of this inference rule is the automatic identification of a compact assumption A.

Conventionally, some prior approaches have proposed a polynomial-time approximation method for computing a separating automaton. These method are based on a modification of Angluin's L* method for active learning of a regular language. Some prior art approaches have presented a symbolic implementation of this L*-based approach. Nonetheless, the primary drawback of this approach is that there is no approximation bound. That is, in the worst case scenario, the L* method will return the trivial solution $M_1$ as the separating language, and thus provide no benefit in terms of state space reduction that could not be obtained by simply minimizing $M_1$. As such, there exists a need for alleviating the impact of state-explosion problem in compositional verification.

Disclosed is a method, system, and computer program product for computing a minimal deterministic finite automaton that separates two languages. In some embodiments of the present invention, the method uses a sampling approach and a Boolean Satisfiability solver. Yet in some embodiments of the present invention, the method may be applied for the generation of an intermediate assertion for formal verification using assume-guarantee reasoning.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of the invention and, together with the Detailed Description, serve to explain the principles of the invention.

DETAILED DESCRIPTION

Figure 1A:
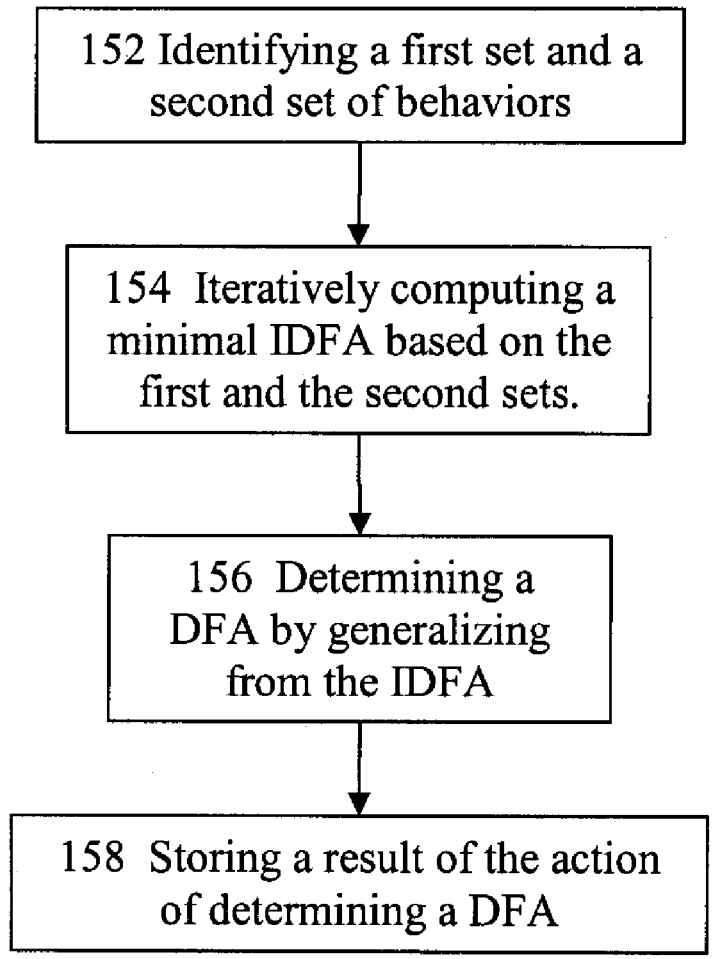
FIG. 1A illustrates a block diagram of the general flow of a method and a system as embodied in some embodiments of the invention for generating automated assumption for compositional verification of an electronic circuit.

Several embodiments of the invention provides a method, system, and computer program product for generating automated assumption for compositional verification. Referring to FIG. 1A, the process begins by identifying a first set and a second set of behaviors of the electronic circuit design at 152. The identified data will be used to characterize the system design (whether electronic hardware, software, or a combination of both hardware and software) as a "finite automaton", where the finite automaton (also referred to as finite state machine) is a model of behavior composed of a finite number of states, transitions between those states, and actions.

Next, the process iteratively computes a minimal "incomplete deterministic finite automaton" (IDFA) based upon sampling of the first and second sets of behavior at 154. A deterministic finite state machine is a finite state machine where for each pair of state and input symbol there is one and only one transition to a next state. In some cases, finite state automaton may be incomplete since it does not contain some information used to model certain behaviors.

Based upon the IDFA, the process determines a deterministic finite automaton (DFA) by generalizing from the minimal IDFA at 156. This is essentially accomplished by performing a learning process to gather sufficient information from the IDFA to determine the DFA. After it is determined, the DFA can be stored on a tangible computer readable medium at 158.

As various embodiments of the invention involve a method and system for generating automated assumption for compositional verification, a mathematical model for compositional verification is first described below to provide basis for some embodiments of the invention.

I. Mathematical Model for Compositional Verification

What is disclosed in this section is a mathematical model used to formally prove the correctness of the software and hardware system in some embodiments of the invention.

Compositional verification decomposes a verification task for the software and hardware system into simpler verification problems for the individual components of the system. A system M comprising two components $M_1$ and $M_2$ and a property P that needs to be verified on M is first considered. The assume-guarantee style for compositional verification uses the following inference rule:

$$\frac{\langle \text{true} \rangle M_1 \langle A \rangle}{\langle \text{true} \rangle M_1 \| M_2 \langle P \rangle} \quad (1)$$

The above inference rule states that P can be verified on M by identifying an assumption A such that: A holds on $M_1$ in all environments and $M_2$ satisfies P in any environment that satisfies A. In a language-theoretic framework, a process as a regular language is modeled, specified by a finite automaton. Process composition is intersection of languages, and a process satisfies a property P when its intersection with $L(:P)$ is empty. The above inference rule can thus be written as:

$$\frac{L(M_1) \subseteq L(A)}{L(A) \cap L(M_2) \cap L(\neg P) = \phi} \quad (2)$$
$$\overline{L(M_1) \cap L(M_2) \cap L(\neg P) = \phi}$$

The method and system then designate the intersection of $L(M_2)$ and $L(:P)$ as $M_2'$. The problem of constructing an assume-guarantee argument then amounts to finding an automaton A that separates $L(M_1)$ and $L(M_2')$, in the sense that $L(A)$ accepts all the strings in $L(M_1)$, but rejects all the strings in $L(M_2')$.

Clearly, one of the objectives is to find an automaton A with as few states as possible to minimize the state explosion problem in checking the antecedents of the assume-guarantee rule.

For deterministic automata, the problem of finding a minimum-state separating automaton is NP-complete. It is reducible to the problem of finding a minimal-state implementation of an incomplete deterministic finite automata (IDFA), shown to be NP-complete. To avoid this complexity, a polynomial-time approximation method based upon a modification of the L* method for active learning of a regular language has been proposed. The primary drawback of this approach is that there is no approximation bound; in the worst case, the method will return the trivial solution $L(M_1)$ as the separating language, and thus provide no benefit in terms of state space reduction that could not be obtained by simply minimizing $M_1$. In fact, in some experiments with hardware verification problems which have been considered in some embodiments of the invention, the approach failed to produce a state reduction for any of the benchmark problems.

The disclosed mathematical model solves the minimal separating automaton problem exactly. Since the overall verification problem is PSPACE-complete when $M_1$ and $M_2'$ are expressed symbolically, there is no reason to require that the sub-problem of finding an intermediate assertion be solved in polynomial time. Moreover, the goal of assume-guarantee reasoning is a verification procedure with complexity proportional to $|M_1|+|M_2'|$ rather than $|M_1|\times|M_2'|$. If this is achieved, it may not matter that the overall complexity is exponential in $|A|$, provided A is small.

With this rationale in mind, some embodiments of the invention present an exact approach to the minimal separating automaton problem, suited to assume-guarantee reasoning for hardware verification. Some embodiments of the invention employ the sampling-based method for the IDFA minimization problem. This method iteratively generates sample strings in $L(M_1)$ and $L(M_2')$, computing at each step a minimal automaton consistent with the sample set. Finding a minimal automaton consistent with a set of labeled strings is itself an NP-complete problem. Some embodiments of the invention then solve it by using a Boolean satisfiability (SAT) solver. The sampling approach is used because the standard techniques for solving the IDFA minimization problem require explicit state representation, which may be impractical for hardware verification.

For hardware applications, the fact that the alphabet is exponential in the number of Boolean signals connecting $M_1$ and $M_2$ must also be taken into account. This difficulty is also observed in L*-based approaches, where the number of queries is proportional to the size of the alphabet. Some embodiments of the invention handles this problem by learning an automaton over a partial alphabet and generalizing to the full alphabet using Decision Tree Learning methods.

Using a collection of synthetic hardware benchmarks, some embodiments of the invention show that this approach is effective in producing exact minimal intermediate assertions in cases where the approximate L* approach yields no reduction. In some cases, this provides a substantial reduction in overall verification time compared to direct model checking using state-of-the-art methods.

A. Deterministic Finite Automaton (DFA)

DEFINITION 1. A Deterministic Finite Automaton (DFA) M is a quintuple $(S, \Sigma, s_0, \delta, F)$ where: (1) S is a finite set of states, (2) $\Sigma$ is a finite alphabet, (3) $\delta$: $S \times \Sigma \rightarrow S$ is a transition function, (4) $s_0 \in S$ is the initial state, and (5) $F \subseteq S$ is the set of accepting states or the set of final states. Note that F may be an empty set.

DEFINITION 2. An Incomplete Deterministic Finite Automaton (IDFA) M is a six tuple $(S, \Sigma, \delta, s_0, F, R)$ where: (1) S is a finite set of states, (2) $\Sigma$ is a finite alphabet, (3) $\delta$: $S \times \Sigma \rightarrow S$ is a partial transition function, (4) $s_0 \in S$ is the initial state, (5) $F \subseteq S$ is the set of accepting states, and (6) $R \subseteq S$ is the set of rejecting states.

Intuitively, an IDFA is incomplete because some states may not have outgoing transitions for the complete alphabet, and some states are neither accepting nor rejecting. If there is no transition from state s on symbol a then $\delta(s, a) = \bot$. For both DFA's and IDFA's, the transition function $\delta$ may be extended in the usual way to apply to strings. That is, if $\pi \in \Sigma^*$ and $a \in \Sigma$ then $\delta(s, \pi a) = \delta(\delta(s, \pi), a)$ when $\delta(s, \pi) \neq \bot$ and $\delta(s, \pi a) = \bot$ otherwise.

A string s is accepted by a DFA M if $\delta(s_0, s) \in F$, otherwise s is rejected by M. A string s is accepted by an IDFA if $\delta(q_0, s) \in F$. A string s is rejected by an IDFA M if $\delta(q_0, s) \in R$.

Given two languages $L_1, L_2 \subseteq \Sigma^*$, a DFA or IDFA separates L1 and L2 when it accepts all strings in $L_1$ and rejects all strings in $L_2$. A minimal separating automaton (MSA) for $L_1$ and $L_2$ is an automaton with minimal number of states separating $L_1$ and $L_2$.

B. The L* Approach

For comparison purposes, the L*-based approximation method for learning separating automata is first described. In the L* method, a learner infers the minimal DFA A for an unknown regular language L by posing queries to a teacher. In a membership query, the learner provides a string $\pi$, and the teacher replies yes if $\pi \in L$ and no otherwise. In an equivalence query, the learner proposes an automaton A, and the teacher replies yes if L(A)=L and otherwise provides a counterexample. The counterexample may be positive (i.e., a string in L\L(A)) or negative (i.e., a string in L(A)\L). The method for the learner that guarantees to discover A in a number of queries polynomial in the size of A is well known to one skilled in the art.

The Cobleigh method modifies this procedure slightly to learn a separating automaton for two languages $L_1$ and $L_2$. This differs from the L* method only in the responses provided by the teacher. In the case of an equivalence query, the teacher responds yes if A is a separating automaton for $L_1$ and $L_2$. Otherwise, it provides either a positive counterexample as a string in $L_1 \backslash L(A)$ or a negative counterexample as a string in $L_2 \cap L(A)$. To a membership query on a string $\pi$, the teacher responds yes if $\pi \in L_1$ and no if $\pi \in L_2$. If $\pi$ is in neither $L_1$ nor $L_2$, the choice is arbitrary. Since the teacher does not know the minimal separating automaton, it cannot provide the correct answer, so it simply answers no. Thus, in effect, the teacher is asking the learner to learn $L_1$, but is willing to accept any guess that separates $L_1$ and $L_2$. Using Angluin's method for the learner, it can be shown that the learned separating automaton A has no more states that the minimal automaton for $L_1$. This can, however, be arbitrarily larger than the minimal separating automaton.

As in Angluin's original method, the number of queries is polynomial in the size of A, and in particular, the number of equivalence queries is at most the number of states in A. In the assume-guarantee application, $L_1 = L(M_1)$ and $L_2 = L(M_2')$. For hardware verification, $M_1$ and $M_2'$ are nondeterministic finite automata (NFA's) represented symbolically (the nondeterminism arising from hidden inputs and from the construction of the automaton for :P). Answering a membership query is therefore NP-complete, which is essentially a bounded model checking problem, while answering an equivalence query is PSPACE complete, which is a symbolic model checking problem. Thus, in practice, the execution time of the method is singly exponential.

C. Solving the Minimal Separating Automaton Problem Exactly

To find an exact MSA for two languages $L_1$ and $L_2$, the general approach of Pena and Oliveira for minimizing IDFA's will be followed in some embodiments. This is a learning approach that uses only equivalence queries. It relies on a subroutine that can compute a minimal DFA separating two finite sets of strings. Although Pena and Oliveira's method is limited to finite state machines, that technique can be applied to any languages $L_1$ and $L_2$ that have a regular separator, even if $L_1$ and $L_2$ are themselves not regular.

The overall flow of the procedure is shown in Process 1. Two sets of sample strings, $S_1 \in L_1$ and $S_2 \in L_2$, are maintained. The main loop begins by computing a minimal DFA A that separates $S_1$ and $S_2$ (using a procedure described below). The learner then performs an equivalence query on A. If A separates $L_1$ and $L_2$, the procedure terminates. Otherwise, a counterexample string $\pi$ from the teacher is obtained. If $\pi \in L_1$, and consequently, $\pi \notin L(A)$ $\pi$ is added to $S_1$, else $\pi$ is added to $S_2$. This procedure is repeated until an equivalence query succeeds. In the following approach, a negative counterexample is tested first, and then a positive counterexample is tested. This order is, nonetheless, arbitrary, and in practice the order may be chosen randomly for each query to avoid biasing the result towards one language.

The teacher in this procedure can be implemented using a model checker. That is, the checks $L_1 \in L(A)$ and $L(A) \cap L_2 = \phi$ are model checking problems. In this application, $L_1$ and $L_2$ are the languages of symbolically represented NFA's, and symbolic model checking methods will be used to perform the checks. Note that testing containment in L(A) requires complementing A, but this is straightforward since A is deterministic.

THEOREM 1. Let $L_1, L_2 \subseteq \Sigma^*$, for finite $\Sigma$. If $L_1$ and $L_2$ have a regular separator, then Process 1 terminates and outputs a minimal separating automaton for $L_1$ and $L_2$.

PROOF. Let A' be a minimal-state separating automaton for $L_1$ and $L_2$ with k states. Since $S_1 \in L_1$ and $S_2 \in L_2$, it follows that A' is also a separating automaton for $S_1$ and $S_2$. Thus, A has no more than k states (since it is a minimal separating automaton for $S_1$ and $S_2$). Thus, if the procedure terminates, A is a minimal separating automaton for $L_1$ and $L_2$. Moreover, there are finitely many DFA's over finite $\Sigma$ with k states. At each iteration, one such automaton is ruled out as a separator of $S_1$ and $S_2$. Thus, the process must terminate.

It now remains only to find a method to compute a minimal separating automaton for the finite languages $S_1$ and $S_2$. This problem has been studied extensively, and is known to be NP-complete.

DEFINITION 3. An IDFA $M = (S, \Sigma, s_0, \delta, F, R)$ is tree-like when the relation $\{(s_1, s_2) \in S^2 | \exists a, \delta(s_1, a) = s_2\}$ is a directed tree rooted at $s_0$.

Given any two disjoint finite sets of strings $S_1$ and $S_2$, a tree-like IDFA that accepts $S_1$ and rejects $S_2$, will be constructed and is called $TREESEP(S_1, S_2)$.

DEFINITION 4. Let $S_1, S_2 \subseteq \Sigma^*$ be disjoint, finite languages. The tree-like separator $TreeSep(S_1, S_2)$ for $S_1$ and $S_2$ is the tree-like DFA $(S, \Sigma, s_0, \delta, F, R)$ where S is the set of prefixes of $S_1 \cup S_2$, so is the empty string, $F=S_1$ and $R=S_2$, and $\delta(\pi, a)=\pi a$ if $\pi a \in S$ else $\perp$.

Oliveira and Silva's method shows that every IDFA A that separates $S_1$ and $S_2$ is homomorphic to TREESEP$(S_1, S_2)$ and this method will be defined in subsequent sections. Thus, to find a separating automaton A of k states, some embodiments of the invention only have to guess a map from the states of TreeSep$(S_1, S_2)$ to the states of A and construct A accordingly. This process is called folding.

DEFINITION 5. Let $M=(S, \Sigma, s_0, \delta, F, R)$ and $M'=(S', \Sigma, s_0', \delta', F', R')$ be two IDFA's over alphabet $\Sigma$. The map $\phi: S \to S'$ is a folding of M onto M' when:
  a. $\phi(s_0)=s_0'$,
  b. for all $s \in S$, $a \in \Sigma$, if $\delta(s, a) \neq \perp$ then $\delta'(\phi(s), a)=\phi(\delta(s,a))$,
  c. for all $s \in F$, $\phi(s) \in F'$ and
  d. for all $s \in R$, $\phi(s) \in R'$.

The following theorem says that every separating IDFA for $S_1$ and $S_2$ can be obtained as a folding of the tree-like automaton TREESEP$(S_1, S_2)$. The map is easily obtained by induction over the tree.

THEOREM 2 (OLIVEIRA AND SILVA). Let $T=(S, \Sigma, s_0, \delta, F, R)$ be a tree-like IDFA, with accepting set $S_1$ and rejecting set $S_2$. Then IDFA A over $\Sigma$ is a separating automaton for $S_1$ and $S_2$ if and only if there exists a folding $\Sigma$ from T to A.

What is shown next is how to construct a folding of the tree T by partitioning its states. If $\Gamma$ is a partition of a set S, the element of $\Gamma$ containing element s of S will be denoted as $[s]_\Gamma$.

DEFINITION 6. Let $M=(S, \Sigma, s_0, \delta, F, R)$ be an IDFA over $\Sigma$. A consistent partition of M is a partition $\Gamma$ of S such that
  a. for all s, $t \in S$, $a \in \Sigma$, if $\delta(s, a) \neq \perp$ and $\delta(t, a) \neq \perp$ and $[s]_\Gamma = [t]_\Gamma$ then $[\delta(s,a)]_\Gamma = [\delta(t,a)]_\Gamma$, and
  b. for all states $s \in F$ and $t \in R$, $[s]_\Gamma \neq [t]_\Gamma$.

DEFINITION 7. Let $M=(S, \Sigma, s_0, \delta, F, R)$ be an IDFA and let $\Gamma$ be a consistent partition of S. The quotient $M/\Gamma$ is the IDFA $(\Gamma, \Sigma, s_0', \delta', A', R')$ such that
  a. $s_0' = [s_0]_\Gamma$,
  b. $\delta'(s', a) = \sqcup \{\delta(s, a) | [s]_\Gamma = s'\}$,
  c. $F' = \{[s]_\Gamma | s \in F\}$, and
  d. $R' = \{[s]_\Gamma | s \in R\}$.

In the above, $\sqcup$ represents the least upper bound in the lattice containing $\perp$, $\top$, and the elements of S. Consistency guarantees that the least upper bound is never $\top$.

THEOREM 3. Let T be a tree-like IDFA with accepting set $S_1$ and rejecting set $S_2$. There exists an IDFA of k states separating $S_1$ and $S_2$ exactly when T has a consistent partition $\Gamma$ of cardinality k. Moreover, $T/\Gamma$ separates $S_1$ and $S_2$.

Proof. Suppose $\Gamma$ is a consistent partition of $S(T)$. It follows that the function $\phi$ mapping s to $[s]_\Gamma$ is a folding of T onto $T/\Gamma$. Thus, by Theorem 2, $T/\Gamma$ is separates $S_1$ and $S_2$, and moreover it has k states. Conversely, suppose A is an IDFA of k states separating $S_1$ and $S_2$. By Theorem 2, there is a folding $\phi$ from T to A. By the definition of folding, the partition induced by $\phi$ is consistent and has (at most) k states.

According to this theorem, to find a minimal separating automaton for two disjoint finite sets $S_1$ and $S_2$, only a corresponding tree-like automaton T needs to be first constructed, and the minimal consistent partition $\Gamma$ of $S(T)$ may then be obtained. The minimal automaton A is then $T/\Gamma$.

In some embodiments, an SAT solver may be used to find the minimal partition, using the following encoding of the problem of existence of a consistent partition of k states. Let $n = \lceil \log_2 k \rceil$. This is the number of bits needed to enumerate the partitions. For each state $s \in S(T)$, a vector of Boolean variables $\bar{v}_s = (v_s^0 \ldots v_s^{n-1})$ is introduced. This represents the number of the partition to which s is assigned and also the corresponding state of the quotient automaton. A set of Boolean constraints that guarantee that the partition is consistent is then constructed. First, for each s, there must exist $\bar{v}_s < k$ (expressed over the bits of $\bar{v}_s$). Then, for every pair of states s and t that have outgoing transitions on symbol a, there exists a constraint $\bar{v}_s = \bar{v}_t \Rightarrow \bar{v}_{\delta(s,a)} = \bar{v}_{\delta(t,a)}$. That is, the partition must respect the transition relation. Finally, for every pair of states $s \in F$ and $t \in R$, the constraint $\bar{v}_s \neq \bar{v}_t$ may then be obtained. That is, a rejecting and an accepting state cannot be put in the same partition. this set of constraints is called SatEnc(T). A truth assignment $\Psi$ satisfies SatEnc(T) exactly when the partition $\Gamma = \{\Gamma_0, \ldots, \Gamma_{k-1}\}$ is a consistent partition of T where $\Gamma_i = \{s \in S | \bar{v}_s = i\}$. Thus, from a satisfying assignment, a consistent partition may be extracted.

A minimal separating automaton for finite sets $S_1$ and $S_2$ can be found by Process 2. Note that the quotient automaton $T/\Gamma$ is an IDFA. Th $T/\Gamma$ may be converted to a DFA by completing the partial transition function $\delta$ any way of choice, for example, by making all the missing transitions go to a rejecting state, yielding an DFA that separates $S_1$ and $S_2$. This completes the procedure for computing an MSA of two languages $L_1$ and $L_2$ in some embodiments of the invention.

Process 2 Computing MSA for finite languages, using SAT encoding SAMPLEMSA $(S_1, S_2)$

| | |
|---|---|
| 1. | Let T = TREESEP$(S_1, S_2)$; |
| 2. | Let k = 1; |
| 3. | while (1) do |
| 4. |   if SATENC(T) is satisfiable then |
| 5. |     Let $\psi$ be a satisfying assignment of SatEnc(T); |
| 6. |     Let $\Gamma = \{\{s \in S(T) | \bar{v}_s = i\} | i \in 0 \ldots k-1\}$; |
| 7. |     Let A = T/$\Gamma$; |
| 8. |     Extend $\delta(A)$ to a total function in some way; |
| 9. |     return DFA A |
| 10. | Let k = k + 1; |

To find an intermediate assertion for assume-guarantee reasoning, only an MSA for $L(M_1)$ and $L(M_2')$ needs to be computed, using Process 1.

Process 1 The overall procedure

| | |
|---|---|
| 1. | $S_1 = \{\}$; $S_2 = \{\}$; |
| 2. | while (1) do |
| 3. |   Let A be an MSA for $S_1$ and $S_2$; |
| 4. |   if $L_1 \subseteq L(A)$ then |
| 5. |     if $L(A) \cap L_2 = \phi$ then |
| 6. |       return true; (A separates $L_1$ and $L_2$, property holds) |
| 7. |     else |
| 8. |       Let $\pi \subseteq L_2$ and $\pi \subseteq L(A)$; (negative counterexample) |
| 9. |       if $\pi \subseteq L_1$ then |
| 10. |         return false; ($L_1$ and $L_2$ not disjoint, property fails) |
| 11. |       else |
| 12. |         $S_1 = S_1 \cup \{\pi\}$; |
| 13. |   else |
| 14. |     Let $\pi \in L_1$ and $\pi \notin A$; (positive counterexample) |
| 15. |     if $\pi \in L_2$ then |
| 16. |       return false; ($L_1$ and $L_2$ not disjoint, property fails) |
| 17. |     else |
| 18. |       $S_2 = S_2 \cup \{\pi\}$; |

The approach in some embodiments of the invention now considers the overall complexity of this procedure. It may be assumed that $M_1$ and $M_2'$ are expressed symbolically as Boolean circuits with textual size $|M_1|$ and $|M_2'|$ respectively. The number of states of these machines is then $O(2^{|M_1|})$ and $O(2^{|M_2|})$ respectively. Let $|A|$ be the textual size of the MSA. Note this is proportional to both the number of states and the size of $\Sigma$). Each iteration of the main loop involves solving the SAT problem SATENC(T) and solving two model checking problems. The SAT problem can, in the worst case, be solved by enumerating all the possible DFA's of the given size, and thus is $O(2^{|A|})$. The model checking problems are $O(|A| \times 2^{|M_1|})$ and $O(|A| \times 2^{|M_2'|})$. The number of iterations is at most $2^{|A|}$, the number of possible automata, since each iteration rules out one automaton. Thus the overall run time is $O(2^{|A|}(2^{|A|}+|A| \times (2^{|M_1|}+2^{|M_2|})))$. This is singly exponential in $|A|$, $|M_1|$ and $|M_2'|$, but notably the cost of computing the product of $M_1$ and $M_2$ need not be incurred. Fixing the size of A, it may be shown that this method incurs run time of $O(2^{|M_1|}+2|M_2'|)$.

Unfortunately, $|A|$ is worst-case exponential in $|M_1|$, since in the worst case $L(A)=L(M_1)$. This means that the overall complexity is doubly exponential in the input size. It may seem illogical to apply a doubly exponential method to a PSPACE-complete problem. However, it may be observed that in practice, if there is a small intermediate assertion, this approach can be more efficient than singly exponential approaches. In the case when the alphabet is large, however, there may be a need for finding some way to compactly encode the transition function.

D. Generalization with Decision Tree Learning

As mentioned earlier, in hardware verification, the size of alphabet_is exponential in the number of Boolean signals passing between M1 and M2. This means that in practice the samples obtained of $L(M_1)$ and $L(M_2)$ can contain only a miniscule fraction of the alphabet symbols. Thus, the IDFA A learned will also contain transitions for just a small fraction of Σ. Therefore, there may exist a need for finding some way to generalize from this IDFA to a DFA over the full alphabet in a reasonable way. This is not a very well-defined problem. In some sense applying Occam's razor may be performed, inferring the "simplest" total transition function that is consistent with the partition transition function of the IDFA. There might be many ways to do this. For example, if the transition from a given state on symbol a is undefined in the IDFA, it may be mapped to the next state for the nearest defined symbol, according to some distance measure.

The approach taken here is to use decision tree learning methods to try to find the simplest generalization of the partial transition function as a decision tree. Given an alphabet symbol, the decision tree branches on the values of the Boolean variables that define the alphabet, and at its leaves gives the next state of the automaton. In some embodiments, it may be desired to find the simplest decision tree expressing a total transition function consistent with the partial transition function of the IDFA. Put another way, the transition function of any state may be deemed as a classifier, classifying the alphabet symbols according to which state they transition to. The partial transition function can be thought of as providing "samples" of this classification and it may be desired, in some embodiments, to find the simplest decision tree that is consistent with these samples. Intuitively, the intermediate assertion may be expected to depend on only a small set of the signals exchanged between $M_1$ and $M_2$ thus it may be desired, in some embodiments, to bias the procedure towards transition functions that depend on few signals. To achieve this, the ID3 method may be used for learning decision trees from examples in some embodiments.

This allows us, in line 8 of Process 2 to generalize the IDFA to a symbolically represented DFA that represents a guess as to what the full separating language should be, based on the sample of the alphabet seen thus far. If this guess is incorrect, the teacher will produce a counterexample that refutes it, and thus refines the next guess.

II. Illustrative Embodiments of the Invention

Figure 1B:
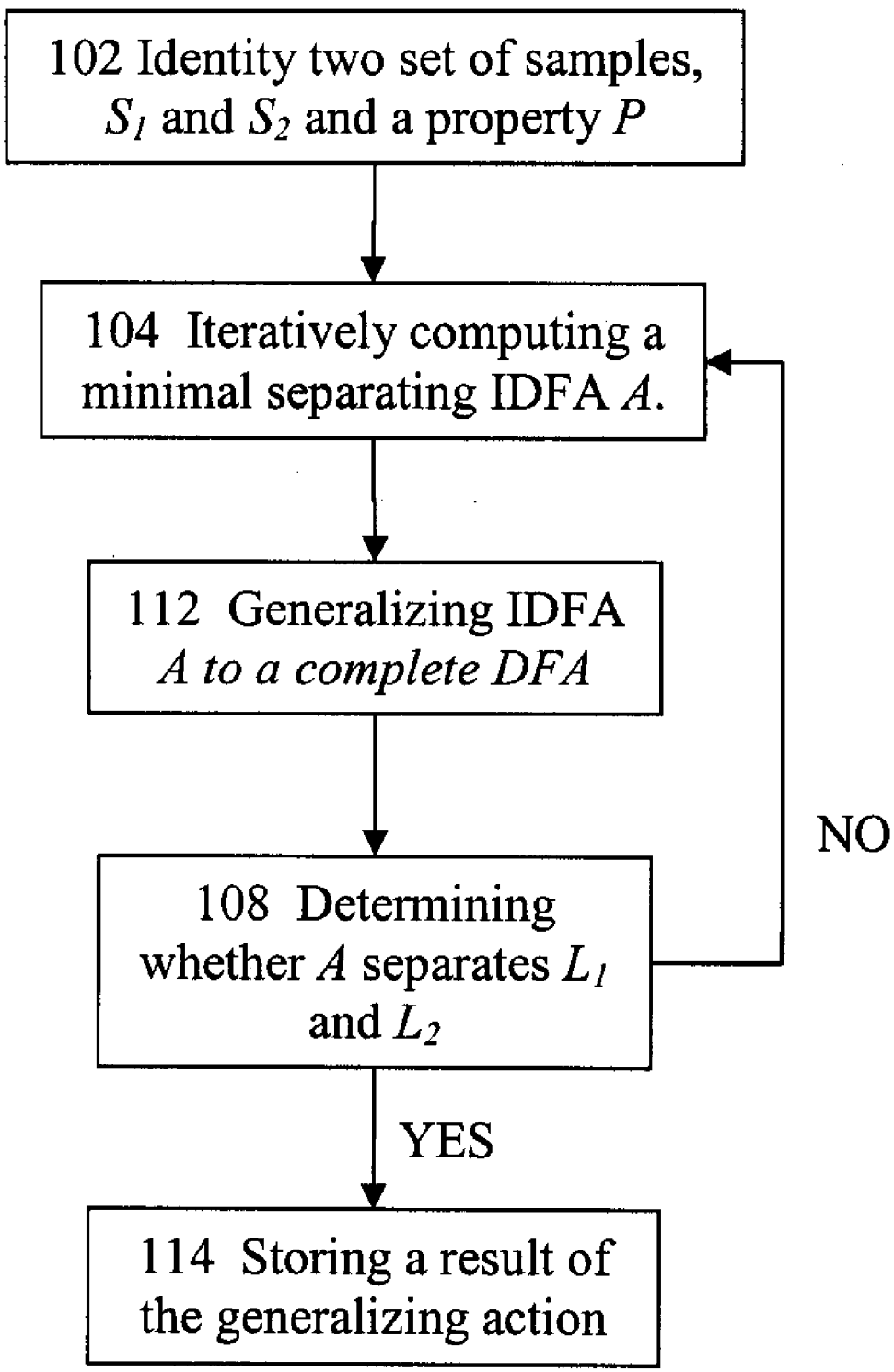
FIG. 1B illustrates a block diagram of more details of the general flow of a method and a system as embodied in some embodiments of the invention for generating automated assumption for compositional verification of an electronic circuit.

Referring to FIG. 1B which illustrates a block diagram of the general flow of a method and a system as embodied in some embodiments of the invention for generating automated assumption for compositional verification of an electronic circuit. At 102, the method first identifies two sets of samples, $S_1$ and $S_2$ in some embodiments of the invention. Yet some embodiments of the invention further identify a property to be verified. The method and system then iteratively compute a minimal separating incomplete deterministic finite automaton (IDFA) at 104. At 112, the method and system generalizes the previously computed IDFA and output a complete DFA and proceeds to 108. In one embodiment, the method and system proceed to determine whether the incomplete deterministic finite automaton A separates $L_1$ and $L_2$ at 108.

If it is determined that the incomplete deterministic finite automaton A separates $L_1$ and $L_2$ at 108, the iterative procedure terminates and proceeds to 114. Otherwise, the method and system repeat the actions 104-108 until the incomplete deterministic finite automaton A is determined to separate $L_1$ and $L_2$ exactly. After the action of determining whether A separates $L_1$ and $L_2$, the method and system then store a result of the generalizing action on a tangible computer readable medium at 114.

Figure 2:
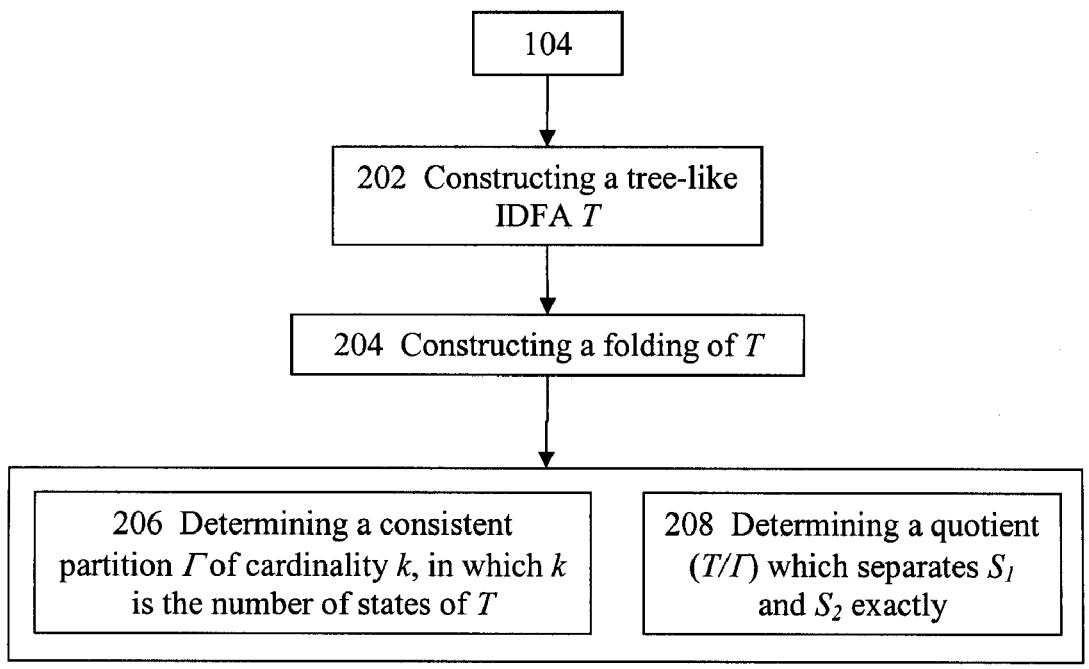
FIG. 2 illustrates more details concerning the action of iteratively computing a minimal separating incomplete deterministic finite automaton (IDFA).

Referring to FIG. 2 which illustrates more details concerning the action of iteratively computing a minimal separating incomplete deterministic finite automaton (IDFA). At 202, the method and system constructs a tree-like incomplete deterministic finite automaton (IDFA) T. The method and system then construct a folding of the IDFA T at 204. At 206, the method and system then determine a consistent partition Γ of cardinality k which represents the number of states of the incomplete deterministic finite automaton T. In the meantime, the method and system determine a quotient T/Γ. According to the mathematical model presented above, the quotient T/Γ separates the two sets of samples, $S_1$ and $S_2$, exactly.

Figure 3:
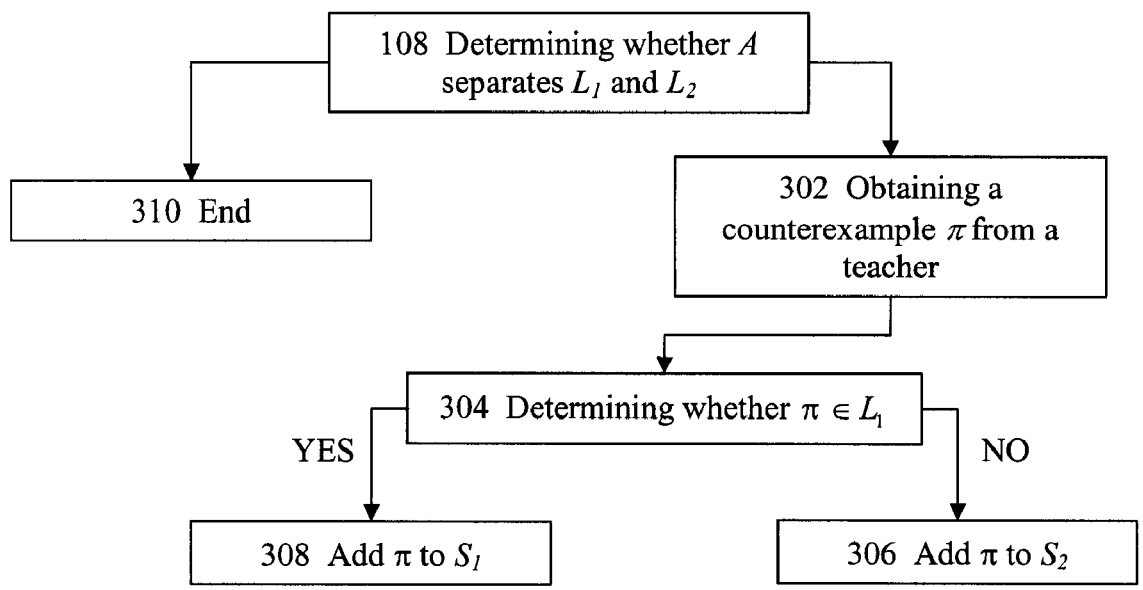
FIG. 3 illustrates further details of the action of determining whether A separates two languages.

Referring to FIG. 3 which illustrates further details of the action of determining whether A separates $L_1$ and $L_2$ at 108. Where the incomplete deterministic finite automaton A is determined to separate $L_1$ and $L_2$, the iterative procedure terminates, and the method and system proceed to action 110 at 310. Where the incomplete deterministic finite automaton A is determined not to separate $L_1$ and $L_2$, the method and system obtain a counterexample π at 302. In one embodiment, the method and system obtain the counterexample π from, for example, a teacher. After obtaining the counterexample π, the method and system then determine whether the counterexample π belongs to $L_1$ at 304. At 308, where the counterexample π is determined to belong to $L_1$, the method and system then add the counterexample π to the first set of examples, $S_1$. At 306, where the counterexample π is determined not to belong to $L_1$, the method and system then add the counterexample π to the second set of examples, $S_2$.

Figure 4:
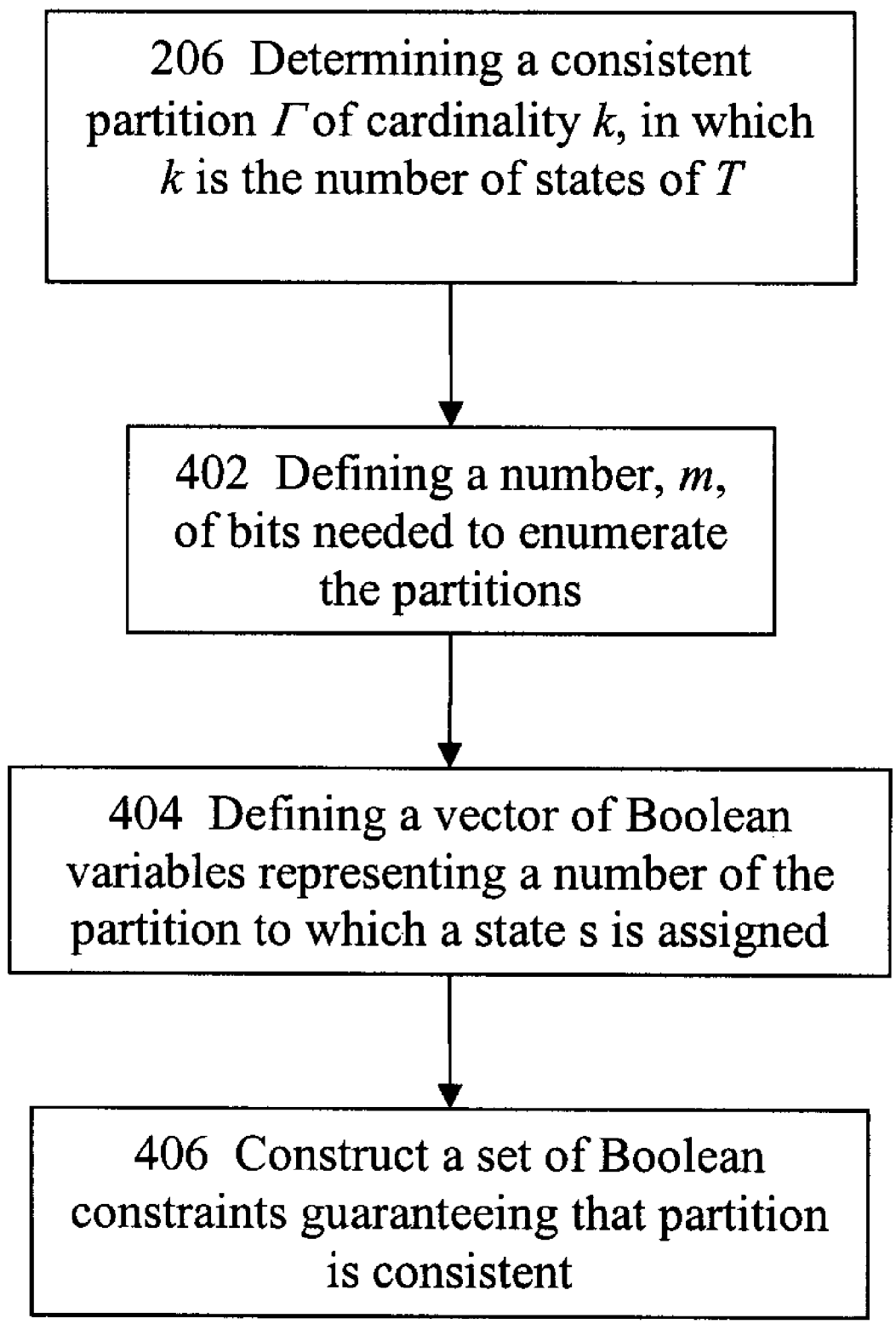
FIG. 4 illustrates further details of the action of determining the consistent partition Γ.

Referring to FIG. 4 which illustrates further details of the action of determining the consistent partition Γ of 206. At 402, the method and system first define a number of bits, m, needed to enumerate the partitions. In one embodiment, Γ is of cardinality k which represents the number of states of the tree-like IDFA over $S_1$ and $S_2$. In another embodiment, $m=\log_2 k$. At 404, the method and system define a vector of Boolean variables representing a number of the partition to which a state s is assigned. At 406, the method and system construct a set of Boolean constraints which guarantee that the partition is consistent.

Figure 5:
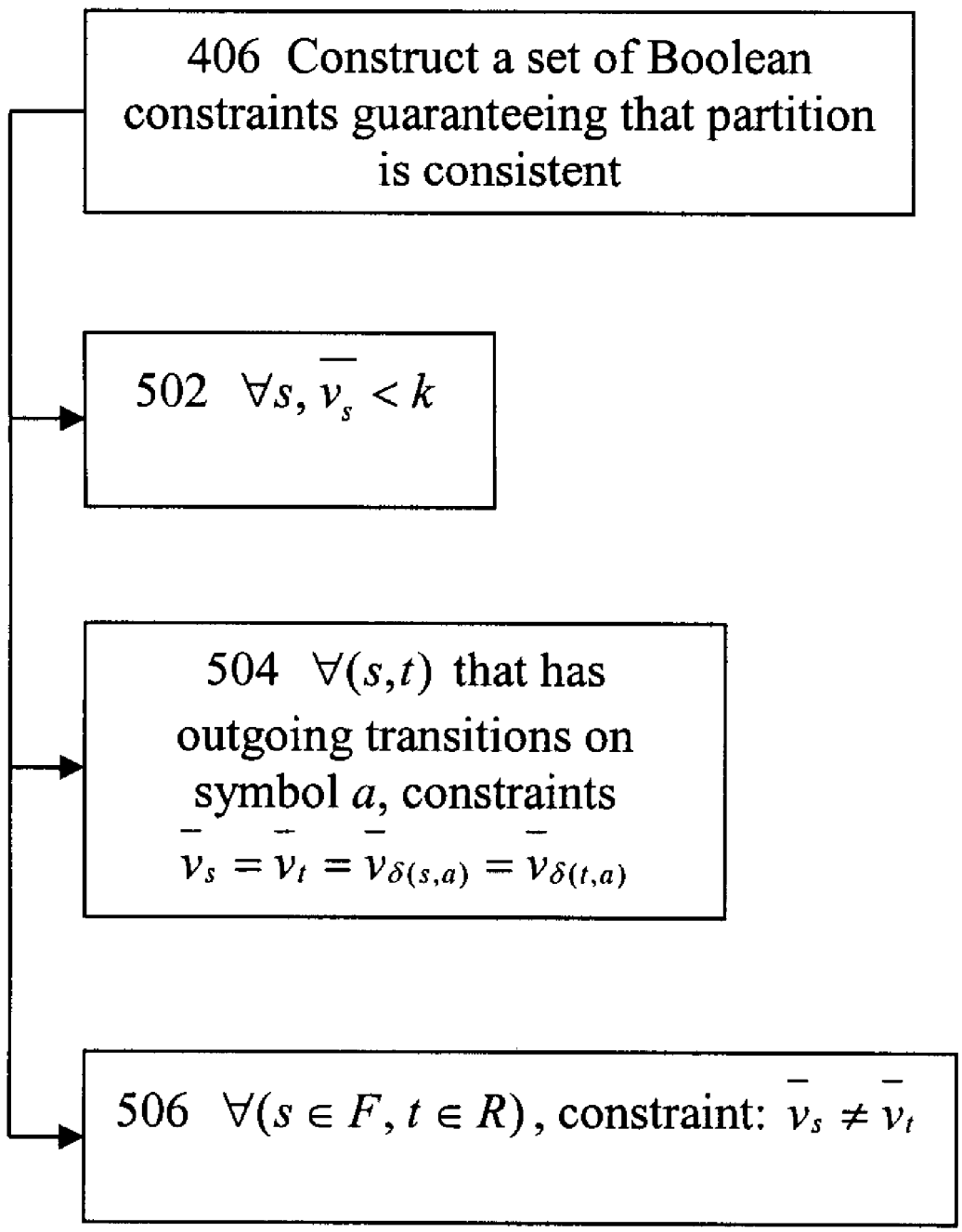
FIG. 5 illustrates further details of the Boolean constraints which guarantee that the partition is consistent.

Referring to FIG. 5 which illustrates further details of the Boolean constraints which guarantee that the partition is consistent. Firstly, 502 shows that for each state s, there must exist $v_s < k$ when expressed over the bits of $v_s$. Furthermore, 504 shows that for every pair of states (s, t) that has outgoing transitions on a symbol a, there exists a constraint $\bar{v}_s = \bar{v}_t = \bar{v}_{\delta(s,a)} = \bar{v}_{\delta(t,a)}$. That is, the partition must respect the transition relation. Moreover, 506 shows that for every pair of states $s \in F, t \in R$, there exists the constraint $\bar{v}_s \neq \bar{v}_t$. In other words, the constraint 506 requires that a rejecting and an accepting state cannot be placed in the same partition.

These constraints 502, 504, and 506 are then used to solve for the vector Boolean variables $v = (v_s^0, \ldots, v_s^{m-1})$. A truth assignment $\Psi$ which satisfies these constraints exactly when the partition $\Gamma = \{\Gamma_0, \ldots, \Gamma_{k-1}\}$ is a consistent partition of T where $\Gamma_i = \{s \in S | v_s = i\}$. Therefore, from a satisfying assignment, a consistent partition may be extracted.

Figure 6:
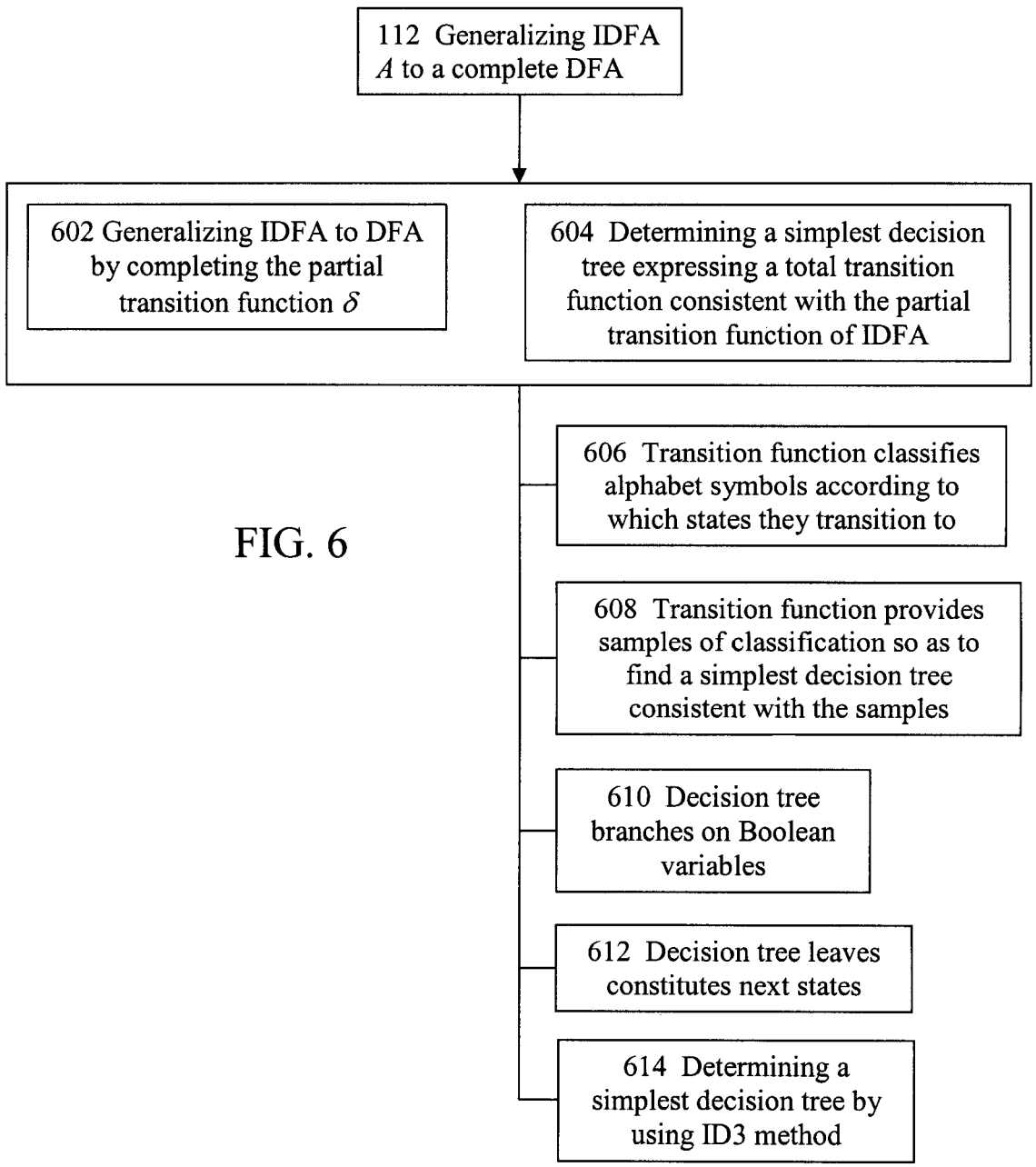
FIG. 6 illustrates further details of the action of generalizing a complete DFA from the previously computed IDFA.

Referring to FIG. 6 which illustrates further details of the action of generalizing a complete DFA from the previously computed IDFA. After the termination of action 112 of generalizing the computed incomplete deterministic finite automaton (IDFA) A to a complete deterministic finite automaton (DFA), the method and system may, in some embodiments of the invention, proceed to 602 to generalize the previously computed IDFA to DFA by completing the partial transition function $\delta$. Alternatively, at 604, the method and system may, in some embodiments of the invention, proceed to 604 to determine a simplest decision tree which expresses a total transition function consistent with the partial transition function of the previously computed IDFA.

The transition function of any state may thus be deemed, in some embodiments of the invention, as a classifier classifying the alphabet symbols according to which states the alphabet symbols transition to, 606. The partial transition function may be deemed, in some embodiments of the invention, as providing "samples" of this particular type of classification to aid the finding of the simplest decision tree that is consistent with these samples provided, 608. Moreover, given an alphabet symbol, the decision tree branches on the values of the Boolean variables that refine the alphabet, 610, and at its leaves gives the next state of the automaton, 612. Since the intermediate assertion is intuitively expected to depend on only a small set of the signals exchanged between the two components, $M_1$ and $M_2$, of the software and hardware system, the procedure may be biased towards transition functions that depend on few signals. In some embodiments of the invention, the ID3 method may be used for learning the decision trees from examples provided to achieve this objective, 614.

Figure 7:
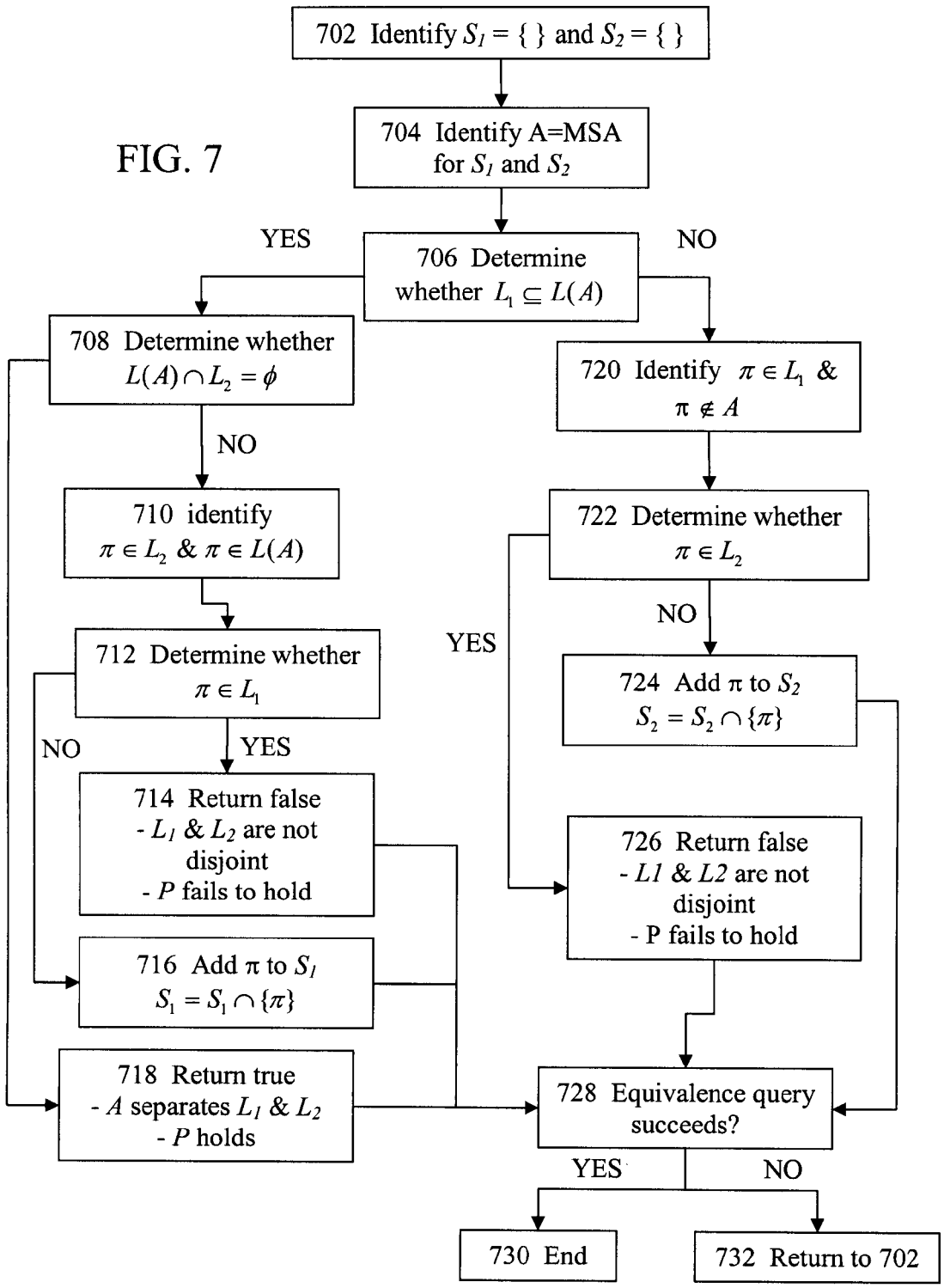
FIG. 7 illustrates a block diagram of the overall procedure as shown above in Process 1.

Referring to FIG. 7 which illustrates a block diagram of the overall procedure as shown above in Process 1. At 702, the method and system first identify two sets of samples $S_1$ and $S_2$. At 704, the method and system further identifies a minimal separating automaton A for the two sets of samples, $S_1$ and $S_2$. The method and system then determine whether $L_1 \subseteq L(A)$ at 706. At 708 where it is determined that $L_1 \subseteq L(A)$, the method and system further determine whether $L(A) \cap L_2 = \phi$. At 718 where it is determined that $L(A) \cap L_2 = \phi$, the method and system return true. That is, the minimal separating automaton A separates $L_1$ and $L_2$, and the property p holds. If it is determined that $L(A) \cap L_2 \neq \phi$, the method and system identify a counterexample $\pi$ where $\pi \in L_2$ & $\pi \in L(A)$ at 710. The method then determines whether the counterexample $\pi \in L_1$ at 712. If the counterexample $\pi \in L_1$, the method and system then return false at 714. That is, $L_1$ and $L_2$ are not disjoint and p fails to hold. If it is determined that $\pi \notin L_1$ the method and system then add the counterexample $\pi$ to $S_1$ at 716.

If it is determined at 706 that $L_1 \subseteq L(A)$ is false, the method and system then identify a counter example $\pi$ satisfying both $\pi \in L_1$ and $\pi \notin A$ at 720. The method and system then determine whether $\pi \in L_2$ at 722. If it is determined that $\pi \in L_2$, the method and system then return false at 726. That is, $L_1$ and $L_2$ are not disjoint and p fails to hold. On the other hand, if it is determined that $\pi \notin L_2$, the method and system then add $\pi$ to $S_2$ at 724. After the actions 714, 716, 718, 724, and 726, the method and system then determine whether equivalence query succeeds at 728 and terminates the iterative process at 730 if the equivalence query succeeds. Alternatively, at 732, the method and system returns back to 702 where it is determined that the equivalence query fails at 728.

Figure 8:
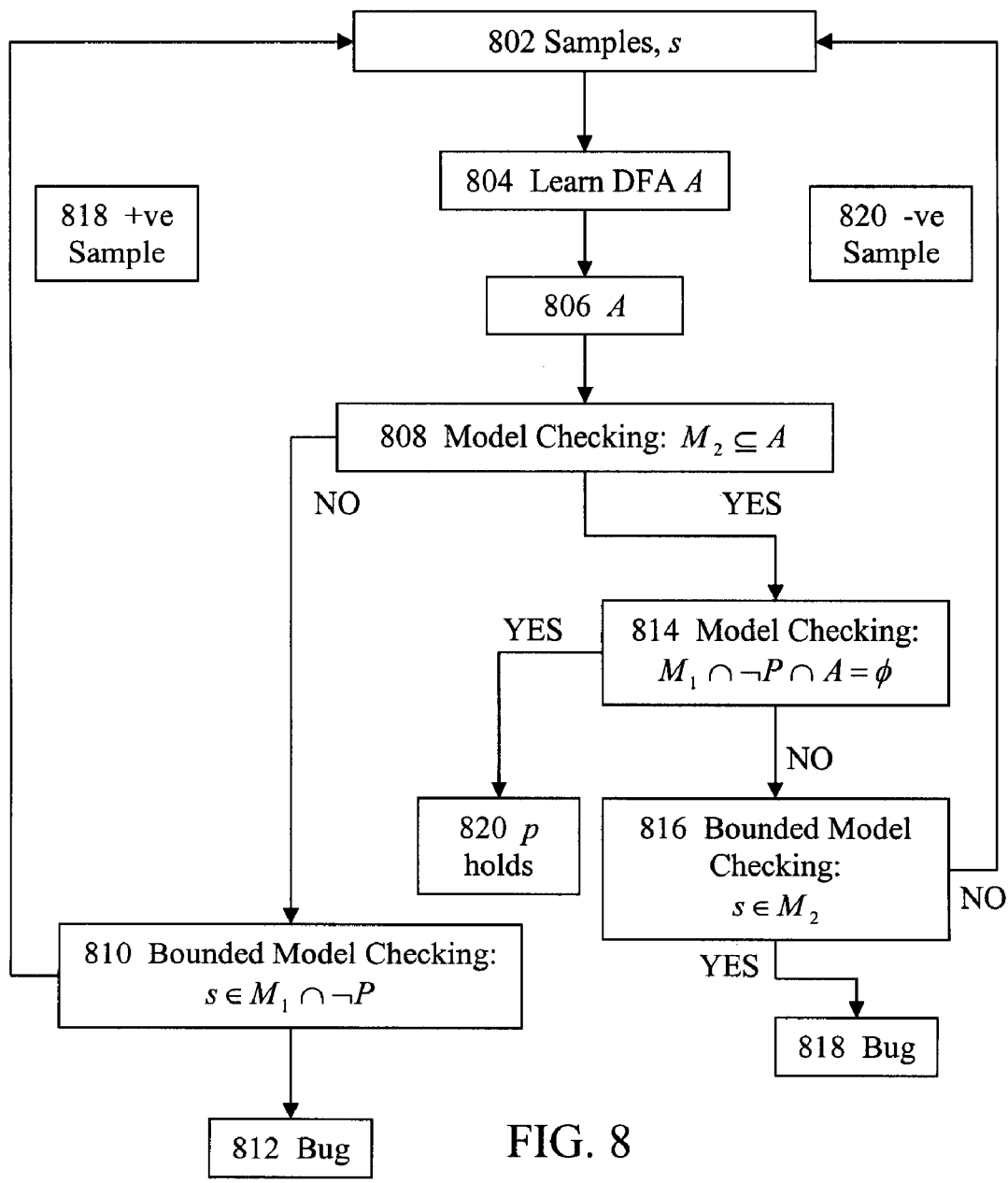
FIG. 8 illustrates a method of automated generation of assumption according to another embodiment of the invention.

Referring to FIG. 8 which illustrates another embodiment of the invention. At 802, the method and system start with a set of samples which is iteratively generated. At 804 the method and system invoke a learning method to generate a complete a complete DFA A, 806. At 808, the method and system determine whether $M_2 \subseteq A$. In another embodiment, the determination of $M_2 \subseteq A$ constitutes a model checking call.

At 810 where it is determined that the determination of $M_2 \subseteq A$ fails, the method and system further determines whether $s \in M_1 \cap \neg P$ In another embodiment, the determination of $s \in M_1 \cap \neg P$ constitutes a bounded model checking call. If the determination of $s \in M_1 \cap \neg P$ returns false, a bug is reported at 812. Alternatively, if the determination of $s \in M_1 \cap \neg P$ returns true, the method and system then return and add a positive sample to the set of sample first identified at 820.

At 814 where it is determined that the determination of $M_2 \subseteq A$ holds, the method and system further determines whether $M_1 \cap \neg P \cap A = \phi$. In another embodiment, the determination of $M_1 \cap \neg P \cap A = \phi$ constitutes a model checking call. If the determination of $M_1 \cap \neg P \cap A = \phi$ returns true at 814, the property p holds at 820. If the determination of $M_1 \cap \neg P \cap A = \phi$ returns false at 814, the method and system further determines whether the sample $s \in M_2$ at 816. In another embodiment, the determination of whether $s \in M_2$ constitutes a bounded model checking call. Where it is determined that $s \in M_2$ at 816, the method and system reports a bug, or the property p fails to hold, 818. Where it is determined that $s \in M_2$ fails at 816, the method and system return and add a negative sample to the set of sample first identified at 820.

Figure 9:
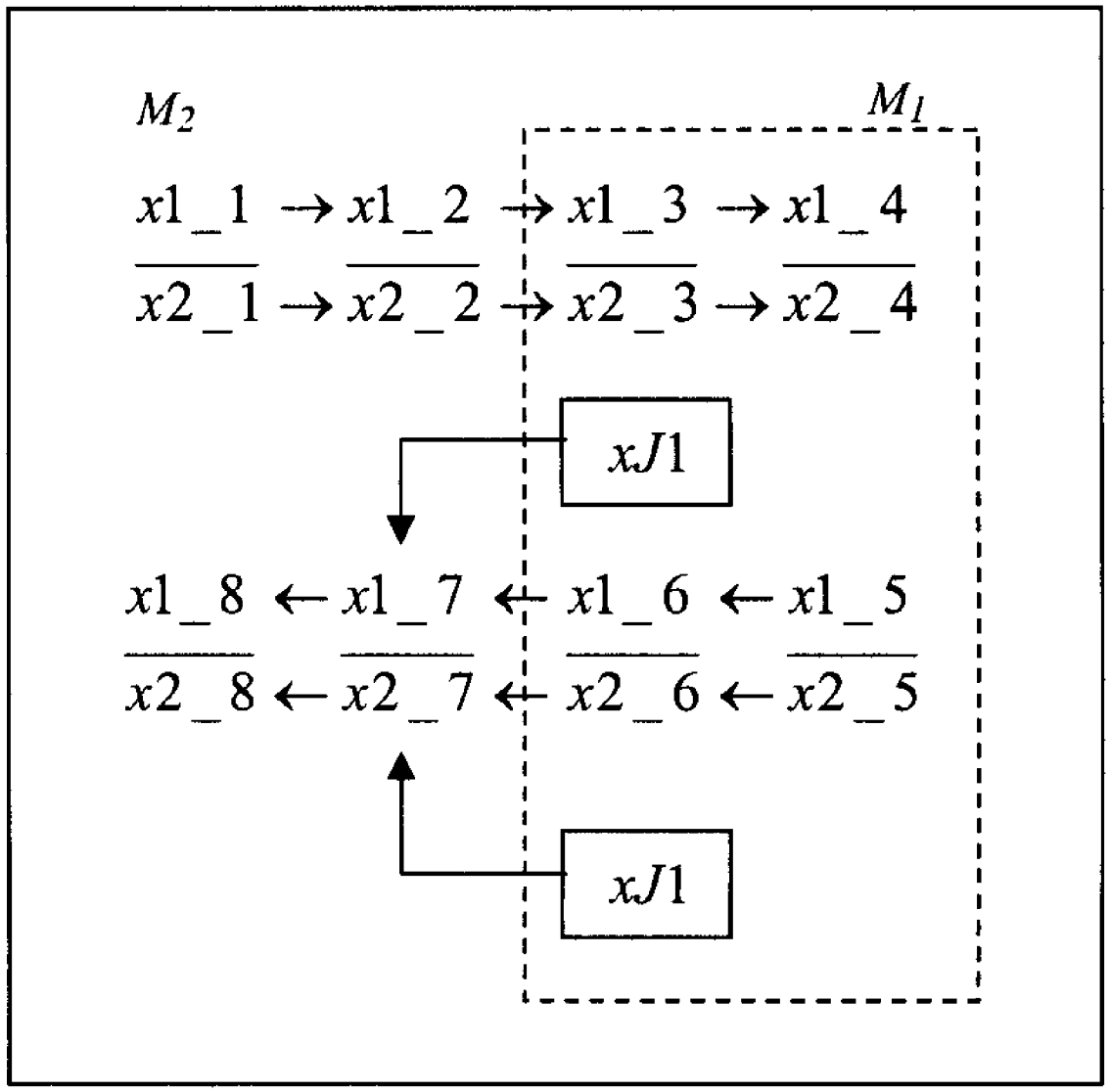
FIG. 9 illustrates an exemplary hardware circuit which comprises a two-bit shift register.

Referring to FIG. 9 which illustrates an exemplary hardware circuit which comprises a two-bit shift register. Data is shifting from x1_1, x2-1 to x1_8, x2_8. xJ1 and xJ2 stand for free inputs. The value of x1_7 is updated only if xJ1 is 1. Similarly, the value of x2_7 is updated only if xJ2 is 1. Initially, all the registers are set to 0. The property to prove states that x1_8 and x2_8 are 1 only if x1_1 and x2_1 have been 1 in the past. For application of assume guarantee, the design may be decomposed into $M_1$ and $M_2$ according to one embodiment of the invention.

Figure 10:
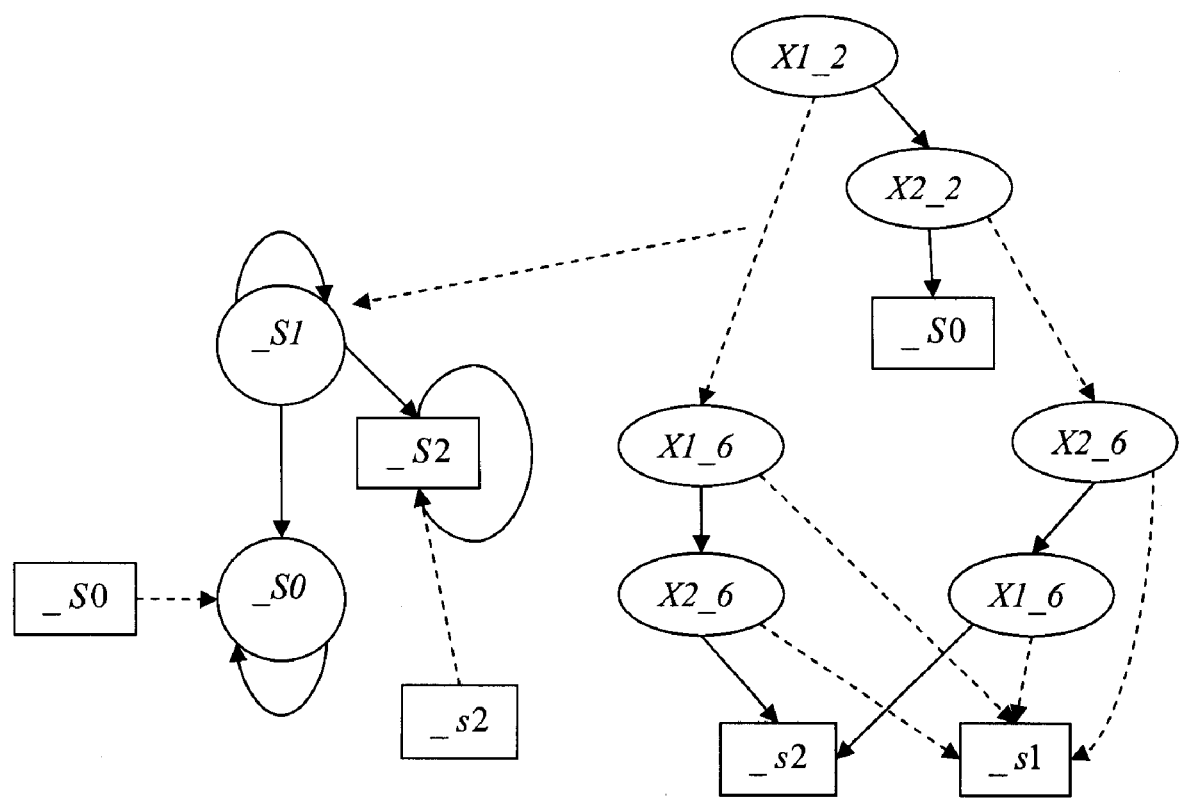
FIG. 10 illustrates the assumption automaton generated by the method in one embodiment of the invention on the circuit shown in FIG. 9.

Referring to FIG. 10 which illustrates the assumption automaton generated by the method in one embodiment of the invention on the circuit shown in FIG. 9. The application of the method in one embodiment of the invention learns a three-state automaton, which is the smallest assumption automaton which can verify the property at hand.

Some embodiments of the invention can be implemented on top of Cadence SMV (Symbolic Model Verifier) or other Symbolic Model Verifiers. In one embodiment of the invention, the user specifies a decomposition of the software and hardware system into two components. The Cadence SMV may be used as the BDD-based model checker to verify the assumptions and further as the incremental BMC engine to check the counterexamples. A SAT-solver is also used in the above implementation. The ID3 method may also be developed to generate the decision trees. The L*-based method proposed by Cobleigh may also be implemented using the optimized version suggested by R. L. Rivest and R. E. Schapire in "*Inference of Finite Automata Using Homing Sequences*", STOC '89: *Proceedings of the Twenty-First Annual ACM symposium on Theory of Computing*, pp. 411-420.

It will be appreciated by those of ordinary skill in the art that some embodiments of the invention can be embodied in other specific forms without departing from the spirit or essential character thereof. The presently disclosed embodiments are therefore considered in all respects to be illustrative and not restrictive. The scope of some embodiments of the invention is indicated by the appended claims rather than the foregoing description, and all changes which come within the meaning and range of equivalents thereof are intended to be embraced therein.

System Architecture Overview

Figure 11:
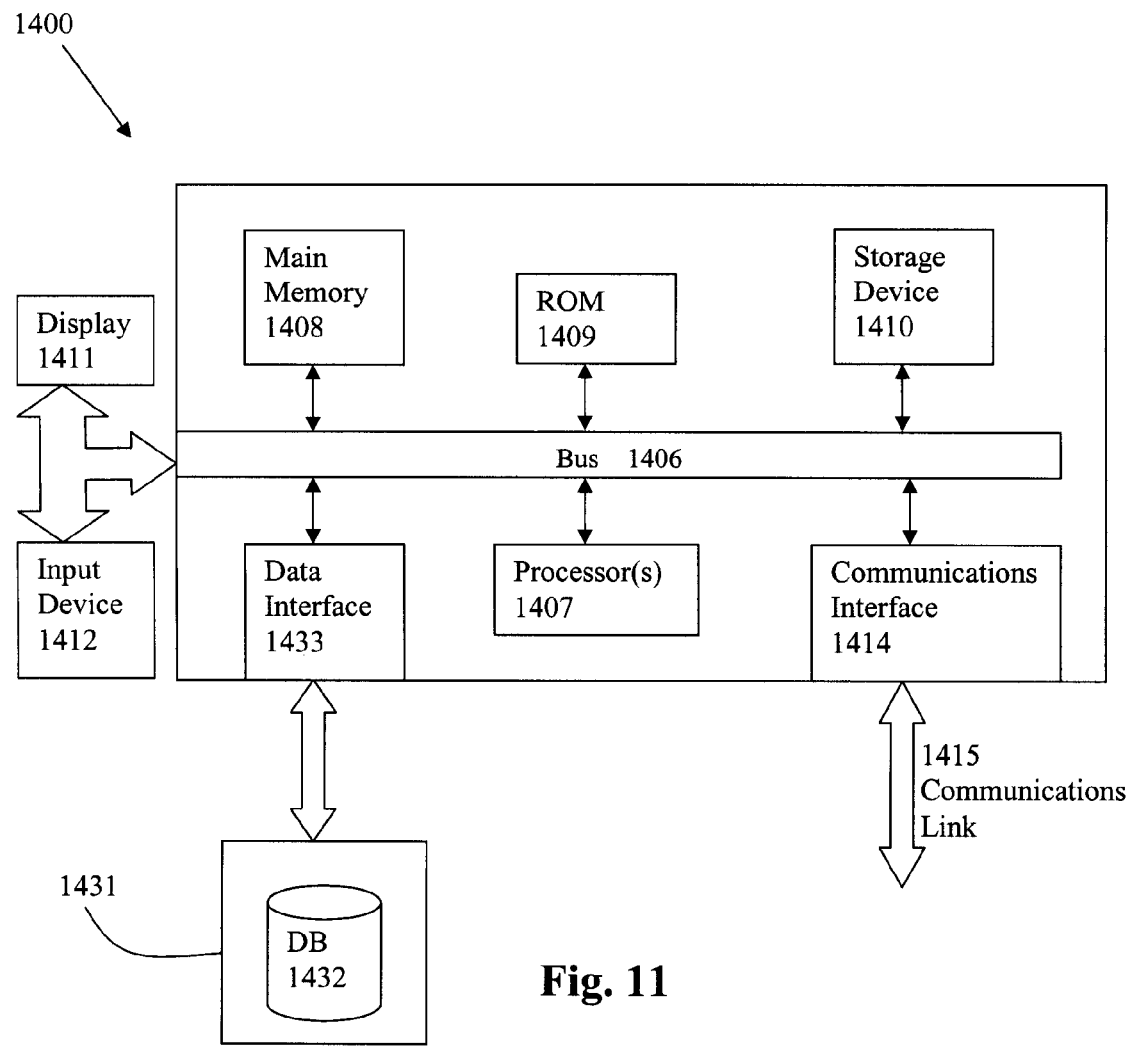
FIG. 11 depicts a computerized system on which a method for timing closure with concurrent process models can be implemented.

FIG. 11 is a block diagram of an illustrative computing system 1400 suitable for implementing an embodiment of the present invention. Computer system 1400 includes a bus 1406 or other communication mechanism for communicating information, which interconnects subsystems and devices, such as processor(s) 1407, main memory 1408 (e.g., RAM), static storage device 1409 (e.g., ROM), storage device 1410 (e.g., magnetic or optical), communication interface 1414 (e.g., modem or ethernet card), display 1411 (e.g., CRT or LCD), input device 1412 (e.g., keyboard), database interface 1433 and cursor control (e.g., mouse or trackball).

According to one embodiment of the invention, computer system 1400 performs specific operations by processor(s) 1407 executing one or more sequences of one or more instructions contained in system memory 1408. Such instructions may be read into main memory 1408 from another computer readable/usable medium, such as static storage device 1409 or storage device 1410. In alternative embodiments, hard-wired circuitry may be used in place of or in combination with software instructions to implement some embodiments of the invention.

The term "computer readable medium" or "computer usable medium" as used herein refers to any medium that participates in providing instructions to processor(s) 1407 for execution. Such a medium may take many forms, including but not limited to, non-volatile media, and volatile media. Non-volatile media includes, for example, optical or magnetic disks, such as storage device 1410. Volatile media includes dynamic memory, such as main memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor(s) 1407 as it is received, and/or stored in storage device 1410, or other non-volatile storage 1431, 1432 for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method for generating automated assumption for compositional verification of an electronic circuit design, comprising:
   using a processor for:
   identifying a first set and a second set of behaviors of the electronic circuit design;
   iteratively computing a minimal incomplete deterministic finite automaton (IDFA) based at least in part upon the first and the second sets of behaviors;
   determining a deterministic finite automaton (DFA) by generalizing from the minimal IDFA, wherein the DFA is determined by performing a learning process to gather information from the IDFA; and
   storing the DFA on a tangible computer readable medium or displaying the DFA on a display device.

2. The method of claim 1, in which the first set of behaviors, $S_1$, satisfies $S_1 \subseteq L_1$ and the second set of behaviors, $S_2$, satisfies $S_2 \subseteq L_2$, wherein $L_1$ is a first language and $L_2$ is a second language.

3. The method of claim 2, further comprising:
   determining whether the minimal IDFA separates $L_1$ and $L_2$.

4. The method of claim 3, in which the action of determining whether the minimal IDFA separates $L_1$ and $L_2$ comprises:
   obtaining a counterexample, in which the minimal IDFA is determined not to separate $L_1$ and $L_2$; and
   determining whether the counterexample belongs to $L_1$.

5. The method of claim 4, further comprising:
   adding the counterexample to the first set, in which the counterexample is determined to belong to $L_1$.

6. The method of claim 4, further comprising:
   adding the counterexample to the second set, in which the counterexample is determined not to belong to $L_1$.

7. The method of claim 4, in which the counterexample is obtained from model checking.

8. The method of claim 2, in which $L_1$ or $L_2$ is not a regular language.

9. The method of claim 2, in which $L_1$ and $L_2$ have a regular separator.

10. The method of claim 1, in which the IDFA separates the first set and the second set.

11. The method of claim 10, in which the action of performing an equivalence query is performed by a learner.

12. The method of claim 1, in which the first set or the second set of behaviors is initially empty.

13. The method of claim 1, further comprising:
identifying a property to be verified.

14. The method of claim 1, further comprising:
performing a query on the minimal IDFA.

15. The method of claim 14, in which the action of determining an automaton comprises determining a minimal separating automaton which separates $S_1$ and $S_2$ exactly by using a SAT solver.

16. The method of claim 1, in which the action of iteratively computing a minimal IDFA comprises:
constructing a folding of a tree-like IDFA over the first set and the second sets;
determining a consistent partition of the tree-like IDFA; and
determining an automaton which separates the first and the second sets exactly.

17. The method of claim 16, in which the consistent partition is of cardinality k which is the number of states of the tree-like IDFA has.

18. The method of claim 16, in which the action of determining a consistent partition comprises:
defining a first number of bits, m, needed to enumerate a partition of k states;
defining a vector of Boolean variables, $\bar{v}_s=(v_s^0 \ldots v_s^{m-1})$, which represents a second number of the partition to which a state is assigned; and
constructing a set of one or more Boolean constraints guaranteeing that the partition is consistent.

19. The method of claim 18, in which m equals $\log_2 k$.

20. The method of claim 18, in which the set of one or more Boolean constraints comprises:
$\bar{v}_s < k$ for each state s.

21. The method of claim 18, in which the set of one or more Boolean constraints comprises:
observing a transition relation by the partition.

22. The method of claim 18, in which the set of one or more Boolean constraints comprises:
placing a rejecting state and a rejecting in different partitions.

23. The method of claim 16, in which each IDFA separating the first set and the second set is homomorphic to the tree-like IDFA over the first set and the second set.

24. The method of claim 16, in which the action of constructing a folding is performed by estimating a map from a plurality of states of the tree-like IDFA over the first set and the second set to another plurality of states of the minimal IDFA separating the first set and the second set.

25. The method of claim 1, in which both the first set and the second set are finite.

26. The method of claim 1, in which a sample in the first set or the second set constitutes a behavior of a circuit component in the electronic circuit design.

27. The method of claim 1, in which the action of determining a DFA by generalizing from the minimal IDFA comprises:
determining a simplest decision tree which expresses a total transition function consistent with a partial transition function of the minimal IDFA.

28. The method of claim 27, in which the total transition function classifies an alphabet symbol according to which states the alphabet symbol transitions to.

29. The method of claim 27, in which the total transition function provides a sample of classification to determine the simplest decision tree consistent with the sample.

30. The method of claim 27, in which the action of determining a simplest decision tree is performed by using an ID3 method.

31. The method of claim 27, in which the action of determining a simplest decision tree is performed by using a decision tree learning method.

32. The method of claim 27, in which the simplest decision tree branches on a Boolean variable defining an alphabet of the DFA.

33. The method of claim 27, in which a leaf of the simplest decision tree indicates a next state of the DFA.

34. A computer program product comprising a computer-usable storage medium having executable code which, when executed by a processor, causes the processor to execute a process for generating automated assumption for compositional verification of an electronic circuit design, the process comprising:
identifying a first set and a second set of behaviors of the electronic circuit design;
iteratively computing a minimal incomplete deterministic finite automaton (IDFA) based at least in part upon the first and the second sets;
determining a deterministic finite automaton (DFA) by generalizing from the minimal IDFA, wherein the DFA is determined by performing a learning process to Rather information from the IDFA; and
storing the DFA on a tangible computer readable medium or displaying the DFA on a display device.

35. The computer program product of claim 34, in which the first set of behaviors, $S_1$, satisfies $S_1 \subseteq L_1$ and the second set of behaviors, $S_2$, satisfies $S_2 \subseteq L_2$, wherein $L_1$ is a first language and $L_2$ is a second language.

36. The computer program product of claim 35, in which the process further comprising:
determining whether the minimal IDFA separates $L_1$ and $L_2$.

37. The computer program product of claim 36, in which the action of determining whether the minimal IDFA separates $L_1$ and $L_2$ comprises:
obtaining a counterexample, in which the minimal IDFA is determined not to separate $L_1$ and $L_2$; and
determining whether the counterexample belongs to $L_1$.

38. The computer program product of claim 34, in which the IDFA separates the first set and the second set.

39. The computer program product of claim 34, in which the first set or the second set of behaviors is initially empty.

40. The computer program product of claim 34, in which the process further comprising:
identifying a property to be verified.

41. The computer program product of claim 34, in which the process further comprising:
performing a query on the minimal IDFA.

42. The computer program product of claim 34, in which the process further comprising:
constructing a folding of a tree-like IDFA over the first set and the second set;
determining a consistent partition of the tree-like IDFA; and
determining an automaton which separates the first set and the second set exactly.

43. The computer program product of claim 42, in which the action of determining a consistent partition of the process comprises:
defining a first number of bits, m, needed to enumerate a partition of k states;

defining a vector of Boolean variables, $\bar{v}_s = (v_s^0 \ldots v_s^{m-1})$ which represents a second number of the partition to which a state is assigned; and constructing a set of one or more Boolean constraints guaranteeing that the partition is consistent.

44. The computer program product of claim 34, in which the action of determining a DFA by generalizing from the minimal IDFA of the process comprises:

determining a simplest decision tree which expresses a total transition function consistent with a partial transition function of the minimal IDFA.

45. A system for generating automated assumption for compositional verification of an electronic circuit design, comprising:

a processor for:

identifying a first set and a second set of behaviors of the circuit design;

iteratively computing a minimal incomplete deterministic finite automaton (IDFA) based at least in part upon the first and the second set of behaviors; and determining a deterministic finite automaton (DFA) by generalizing from the minimal IDFA, wherein the DFA is determined by performing a learning process to gather information from the IDFA; and a tangible computer readable medium for storing the DFA action a display device for displaying the DFA.

46. The system of claim 45, in which the first set of behaviors, $S_1$, satisfies $S_1 \subseteq L_1$ and the second set of behaviors, $S_2$, satisfies $S_2 \subseteq L_2$, wherein $L_1$ is a first language and $L_2$ is a second language.

47. The system of claim 46, further comprising:

means for determining whether the minimal IDFA separates $L_1$ and $L_2$.

48. The system of claim 47, further comprising:

means for obtaining a counterexample, in which the minimal IDFA is determined not to separate $L_1$ and $L_2$; and means for determining whether the counterexample belongs to $L_1$.

49. The system of claim 45, in which the IDFA separates the first set and the second set.

50. The system of claim 45, in which the first set or the second set of behaviors is initially empty.

51. The system of claim 45, in which the process further comprising:

means for identifying a property to be verified.

52. The system of claim 45, further comprising:

means for performing a query on the minimal IDFA.

53. The system of claim 45, further comprising:

means for constructing a folding of a tree-like IDFA over the first set and the second set;

means for determining a consistent partition of the tree-like IDFA; and means for determining an automaton which separates the first set and the second set exactly.

54. The system of claim 53, further comprising:

means for defining a first number of bits, m, needed to enumerate a partition of k states;

means for defining a vector of Boolean variables, $\bar{v}_s = (v_s^0 \ldots v_s^{m-1})$, which represents a second number of the partition to which a state is assigned; and means for constructing a set of one or more Boolean constraints guaranteeing that the partition is consistent.

55. The system of claim 45, further comprising:

means for determining a simplest decision tree which expresses a total transition function consistent with a partial transition function of the minimal IDFA.

* * * * *